United States Patent
Peng et al.

(10) Patent No.: US 10,784,463 B2
(45) Date of Patent: Sep. 22, 2020

(54) DISPLAY PANEL AND DISPLAY DEVICE

(71) Applicant: Xiamen Tianma Micro-Electronics Co.,Ltd, Xiamen (CN)

(72) Inventors: Chao Peng, Xiamen (CN); Zhongjie Zhang, Xiamen (CN); Ruili Cui, Xiamen (CN); Yi Liu, Xiamen (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 0 days.

(21) Appl. No.: 16/503,351

(22) Filed: Jul. 3, 2019

(65) Prior Publication Data
US 2020/0203658 A1 Jun. 25, 2020

(30) Foreign Application Priority Data

Dec. 21, 2018 (CN) .......................... 2018 1 1570370

(51) Int. Cl.
*H01L 51/52* (2006.01)
*G06F 3/044* (2006.01)
*G06F 3/041* (2006.01)
*H01L 27/32* (2006.01)

(52) U.S. Cl.
CPC ........ *H01L 51/5246* (2013.01); *G06F 3/0412* (2013.01); *G06F 3/0446* (2019.05); *H01L 27/323* (2013.01); *H01L 27/3244* (2013.01)

(58) Field of Classification Search
CPC ..... G06F 3/044; G06F 3/0446; H01L 51/5246
See application file for complete search history.

(56) References Cited

U.S. PATENT DOCUMENTS

| | | | | |
|---|---|---|---|---|
| 2013/0026505 | A1* | 1/2013 | Lee | H01L 27/3279 257/88 |
| 2015/0185903 | A1* | 7/2015 | Park | G06F 3/044 345/173 |
| 2016/0293883 | A1* | 10/2016 | Hong | H01L 51/5246 |
| 2018/0013094 | A1* | 1/2018 | Kim | H01L 51/5253 |

FOREIGN PATENT DOCUMENTS

CN 105739154 A 7/2016

* cited by examiner

*Primary Examiner* — Kevin M Nguyen
(74) *Attorney, Agent, or Firm* — Christensen O'Connor Johnson Kindness PLLC

(57) ABSTRACT

A display panel and a display device are provided which can avoid contact between an encapsulant and a first bedding metal, thereby improving the encapsulation effect of the display panel. The display panel includes a display area and a non-display area surrounding the display area, and a first substrate and a second substrate. The first substrate and the second substrate are positioned opposite to each other. The non-display area includes a frit encapsulation area having a first bedding metal that is located on a side of the first substrate facing away from the second substrate.

14 Claims, 9 Drawing Sheets

DISPLAY PANEL AND DISPLAY DEVICE

CROSS-REFERENCE TO RELATED APPLICATIONS

The present application claims priority to Chinese Patent Application No. 201811570370.3, filed on Dec. 21, 2018, the content of which is incorporated herein by reference in its entirety.

BACKGROUND

The present disclosure relates to the field of display technologies, and in particularly, to display panels and display devices. Currently, display panels are usually encapsulated with an encapsulant. FIG. 1 illustrates a schematic diagram of an encapsulation structure in a conventional display panel. The display panel includes a first substrate 1' and a second substrate 2' that are arranged opposite to each other. An encapsulant 3' and a bedding metal 4' are provided between the first substrate 1' and the second substrate 2'. When laser-sintering the encapsulant 3', the bedding metal 4' is used to reflect the laser light to the encapsulant 3', thereby improving the fusion effect of the encapsulant 3'.

However, if the encapsulant 3' and the bedding metal 4' are in direct contact, when the display panel is affected by an external force, the encapsulant 3' will detach from the bedding metal 4' due to the poor contact performance of the encapsulant 3' and the metal material, such that a gap may be formed between the two, which in turn causes the encapsulation to fail.

SUMMARY

In view of the above, embodiments of the present disclosure provide display panels and display devices which avoid contact between an encapsulant and a first bedding metal, thereby improving the encapsulation effect of the display panel.

In one aspect, an embodiment of the present disclosure provides a display panel having a display area and a non-display area surrounding the display area. The display panel includes: a first substrate and a second substrate, the first substrate and the second substrate being arranged oppositely to each other. The non-display area includes a frit encapsulation area and the frit encapsulation area includes a first bedding metal, the first bedding metal is located on a side of the first substrate facing away from the second substrate.

In another aspect, an embodiment of the present disclosure provides an encapsulation method for the display panel provided in any embodiment of the present disclosure. The encapsulation method includes: providing a first substrate and a second substrate, the first substrate is provided with a first bedding metal, and the first bedding metal is located in a frit encapsulation area; providing an encapsulant on the first substrate, the encapsulant being located in the frit encapsulation area; affixing the first substrate on the second substrate, such that the bedding metal is located on a side of the first substrate facing away from the second substrate and overlaps with the encapsulant; and irradiating the frit encapsulation area with laser light along a direction from the second substrate toward the first bedding metal.

In still another aspect, an embodiment of the present disclosure provides a display device, including the display panel provided in any embodiment of the present disclosure.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

In order to better illustrate technical solutions of embodiments of the present disclosure, the accompanying drawings are briefly described below. The drawings described below are merely a part of the embodiments of the present disclosure. Based on these drawings, those skilled in the art can obtain other drawings without any creative effort.

DETAILED DESCRIPTION

For a better understanding of the technical solutions of the present disclosure, the embodiments of the present disclosure will be described in detail below with reference to the accompanying drawings It should be noted that the described embodiments are merely some embodiments of the present disclosure, but not all of the embodiments. All other embodiments obtained by those skilled in the art based on the embodiments of the present disclosure without creative efforts are within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein merely indicates an association relationship to describe the associated object, meaning that there may be three relationships, for example, A and/or B may indicate three cases: A exists individually; A and B exist simultaneously; B exists individually. In addition, the character "/" as used herein generally indicates that the contextual associated objects are in an "or" relationship.

It should be understood that although the terms first, second, third, etc. may be used to describe the inorganic layers in the embodiments of the present disclosure, these inorganic layers should not be limited to these terms. These terms are only used to distinguish inorganic layers from each other. For example, the first inorganic layer may also be referred to as a second inorganic layer, and similarly, the second inorganic layer may also be referred to as a first inorganic layer without deviating from the scope of the embodiments of the present disclosure.

Figure 1:
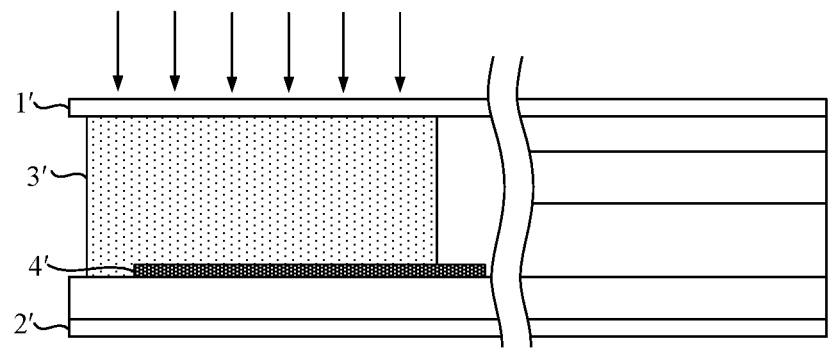
FIG. 1 illustrates a schematic diagram of an encapsulation structure in a conventional display panel.
Figure 2:
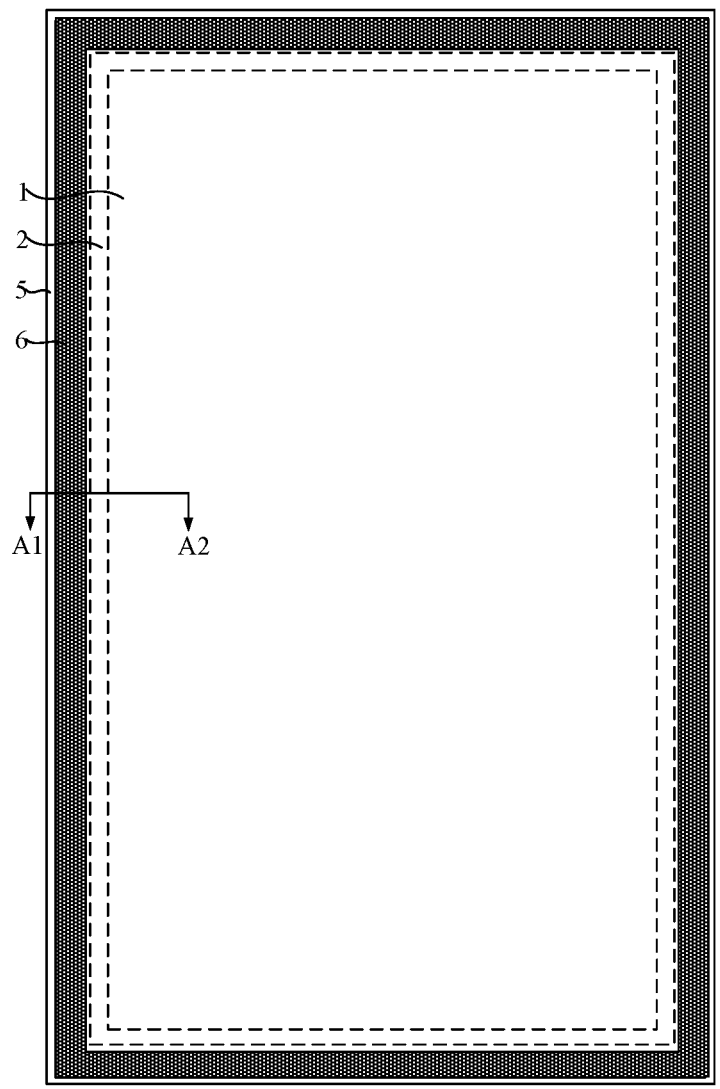
FIG. 2 illustrates a top view of a display panel according to an embodiment of the present disclosure.
Figure 3:
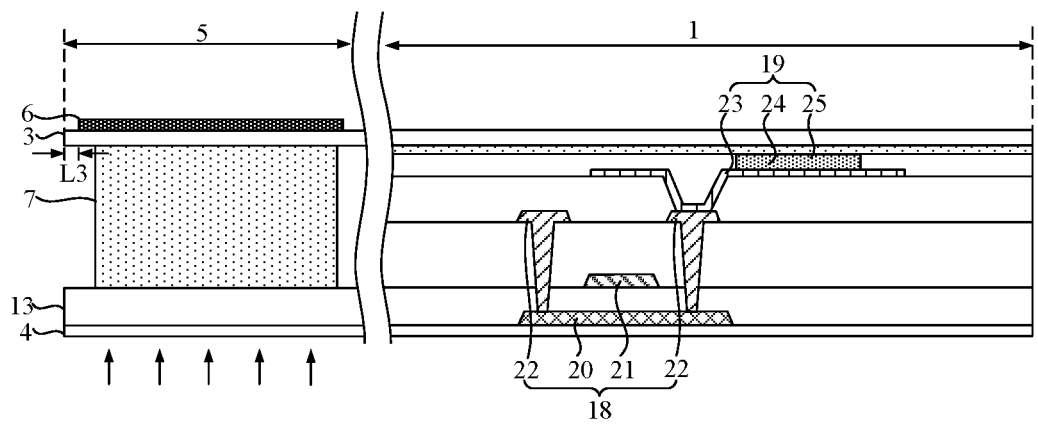
FIG. 3 illustrates a cross-sectional view of FIG. 2 taken along the direction of A1-A2.

As shown in FIG. 2 and FIG. 3, an embodiment of the present disclosure provides a display panel. FIG. 2 illustrates a top view of a display panel according to an embodiment of the present disclosure and FIG. 3 illustrates a cross-sectional view of FIG. 2 taken along the direction of A1-A2. The display panel includes a display area 1, a non-display area 2 surrounding the display area 1, a first substrate 3 and a second substrate 4 opposite to each other. The non-display area 2 includes a frit encapsulation area 5, which includes a first bedding metal 6 located on a side of the first substrate 3 facing away from the second substrate 4.

It should be noted that, in order to achieve encapsulation of the display panel, the frit encapsulation area 5 further includes an encapsulant 7 located between the first substrate 3 and the second substrate 4. When encapsulating the display panel, a welding encapsulation process may be performed, that is, the encapsulant 7 is heated by the laser and then melts so as to bond the first substrate 3 and the second substrate 4 together to avoid intrusion of moisture and oxygen from the outside, thereby achieving stability of display performance. The encapsulant 7 in the embodiment of the present disclosure can be configured as a frit that contains a laser-absorbing pigment that changes to a fusion state after absorbing the laser, so that good adhesion and a better sealing effect can be achieved.

With reference again to FIG. 3, in order to achieve normal image display, the display area 1 includes a thin film transistor 18 and a light-emitting element 19. The thin film transistor 18 includes an active layer 20, a gate layer 21 and a source-drain layer 22, while the light-emitting element 19 includes an anode 23, a light-emitting layer 24, and a cathode 25. When the display panel performs image display, the light-emitting element 19 emits light under the driving of the thin film transistor 18.

In display channels of the present disclosure, by providing the first bedding metal 6 on a side of the first substrate 3 facing away from the second substrate 4, it can be achieved that, on the one hand, when irradiating the frit encapsulation area 5 with a laser along a direction of the second substrate 4 toward the first bedding metal 6 during the encapsulation process, the first bedding metal 6 can reflect the laser so that the reflected laser is again irradiated onto the encapsulant 7 to improve the laser utilization rate and promote the absorption ability of the encapsulant 7 to the laser, thereby achieving a more ideal melting effect and improving the encapsulation effect; on the other hand, it is also possible to avoid direct contact between the encapsulant 7 and the first bedding metal 6, such that the problem of subsequent encapsulation failure caused by poor contact between the encapsulant 7 and the metal material is avoided, which improves the encapsulation stability of the display panel.

Figure 4:
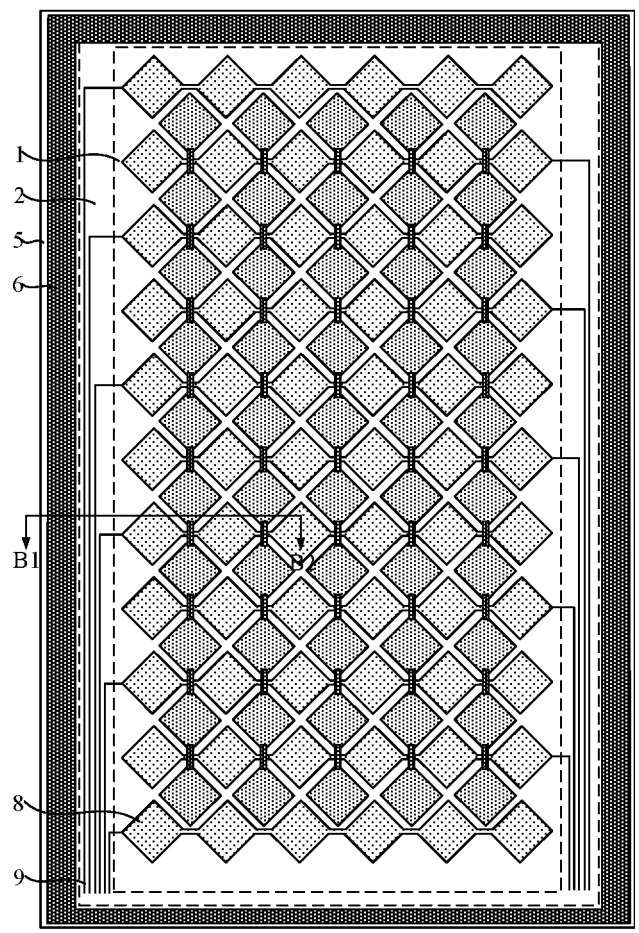
FIG. 4 illustrates another top view of a display panel according to an embodiment of the present disclosure.
Figure 5:
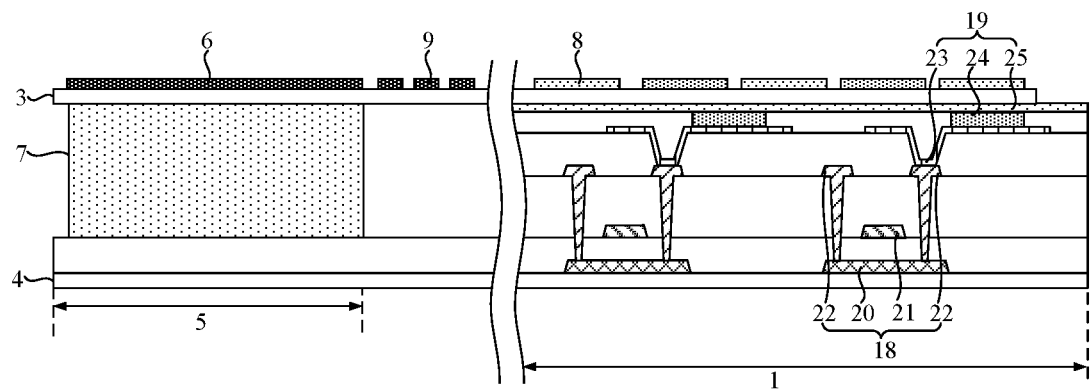
FIG. 5 illustrates a cross-sectional view of FIG. 4 taken along the direction of B1-B2.

FIG. 4 illustrates another top view of the display panel according to the embodiment of the present disclosure and FIG. 5 illustrates a cross-sectional view of FIG. 4 taken along the direction of B1-B2. In order to realize its touch function, the display panel further includes touch electrodes 8 and touch signal lines 9. The touch electrodes 8 are located on a side of the first substrate 3 facing away from the second substrate 4, and the touch signal lines 9 are electrically connected to the touch electrodes 8.

It can be understood that the touch electrodes 8 may include a touch sensing electrode and a touch driving electrode, and provide a touch driving signal to the touch driving electrode during touch detection, such that a coupling capacitance is formed between the touch sensing electrode and the touch driving electrode. When a finger touches the display panel, the coupling capacitance between the touch sensing electrode and the touch driving electrode at the touching position changes, based on which the touch position is determined.

In an embodiment, with reference to FIG. 5 again, the first bedding metal 6 can be provided in the same layer as the touch signal lines 9. It is not required for the first bedding metal 6 to be formed by an additional patterning process, and it is merely required to adopt the same patterning process as the touch signal lines 9, which simplifies the process flow and reduces the manufacturing cost. Moreover, it is not necessary for the first bedding metal 6 to occupy additional film space to prevent a thickness of the display panel from being increased, so that slim design of the display panel can be better realized.

Further, the first bedding metal 6 may also be electrically connected to a fixed potential. In an embodiment, the first bedding metal 6 is electrically connected to the ground signal terminal. With this arrangement, the static charge in the display panel can be exported via the first bedding metal 6 and the fixed potential terminal, such that the static charge is prevented from accumulating inside the display panel, due to which an electrostatic current may be generated, thereby further preventing the electrostatic current from breaking down the display components of the display area 1, which may affect display performance.

Figure 6:
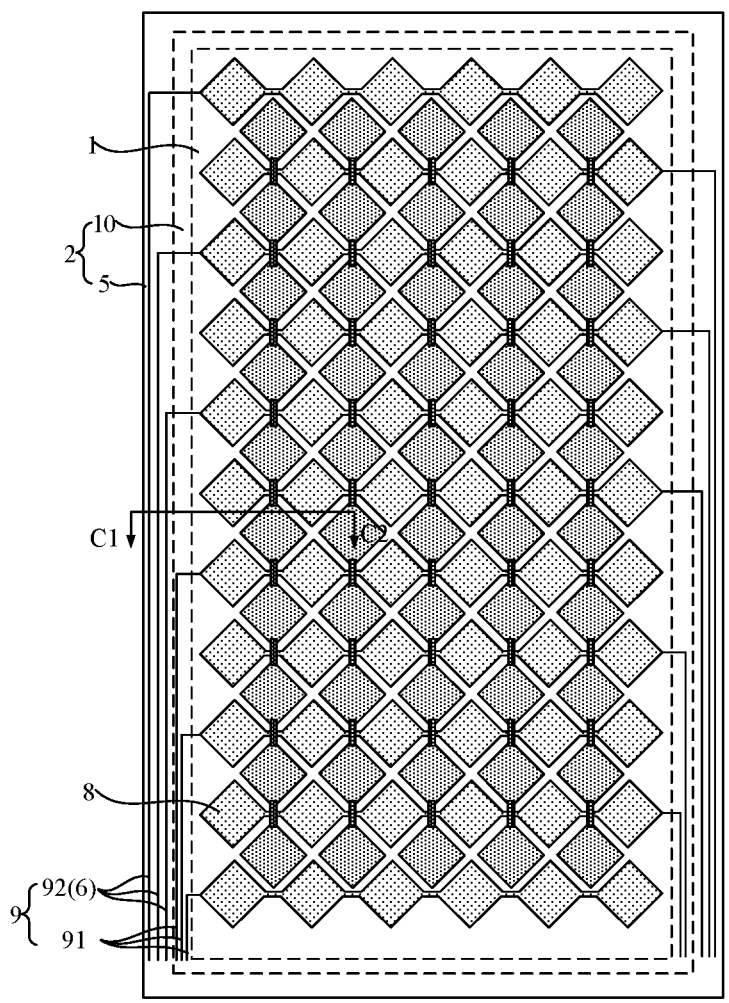
FIG. 6 illustrates still another top view of a display panel according to an embodiment of the present disclosure.
Figure 7:
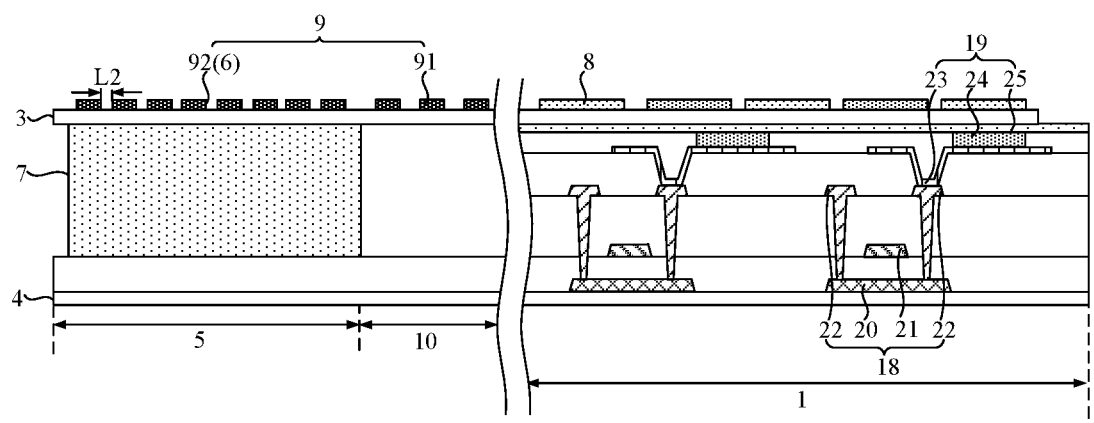
FIG. 7 illustrates a cross-sectional view of FIG. 6 taken along the direction of C1-C2.

FIG. 6 illustrates still another top view of a display panel according to an embodiment of the present disclosure and FIG. 7 illustrates a cross-sectional view of FIG. 6 taken along the direction of C1-C2. The non-display area 2 further includes a peripheral trace area 10, and the peripheral trace area 10 is located on the side of the frit encapsulation area 5 close to the display area 1. The peripheral trace area 10 is used to arrange peripheral driving circuits of the display panel, such as a gate scanning circuit and a light-emitting control circuit. At this time, some touch signal lines 9 are located in the peripheral trace area 10, and the remaining touch signal lines 9 are located in the frit encapsulation area 5 (For ease of understanding, in FIGS. 6 and 7, the touch signal lines 9 located in the peripheral trace area 10 are denoted by reference numeral 91, and the touch signal lines 9 located in the frit encapsulation area 5 are denoted by reference numeral 92). The first bedding metal 6 is reused as the touch signal lines 9 located in the frit encapsulation area 5.

Some touch signal lines 9 are provided in the frit encapsulation area 5, and are reused as the first bedding metal 6, such that on the one hand, these touch signal lines 9 can be used to realize the reflection to the laser, and it is not required for the first bedding metal 6 to be provided additionally on the premise of improving the encapsulation effect of the display panel, thereby reducing the manufacturing cost; on the other hand, some touch signal lines 9 are provided in the frit encapsulation area 5 and the remaining touch signal lines 9 are provided in the peripheral trace area 10, which can reduce the space occupied by the touch signal lines 9 in the peripheral trace area 10, thereby reducing the width of the peripheral trace area 10, so as to better realize narrow border design.

Further, a spacing between two adjacent touch signal lines 9 in the frit encapsulation area 5 can be set to be smaller than a spacing between two adjacent touch signal lines 9 in the peripheral trace area 10. With such configuration, the arrangement density of the touch signal lines 9 in the frit encapsulation area 5 can be increased, and when the touch signal lines 9 are reused as the first bedding metal 6, the reflectivity to the laser can be increased, thereby further improving the encapsulation effect of the encapsulant 7.

In an embodiment, with reference to FIG. 7 again, the spacing between two adjacent touch signal lines 9 in the frit encapsulation area 5 is L2, where $1.5\ \mu m \leq L2 \leq 2\ \mu m$. Setting the minimum value of L2 to 1.5 μm can prevent the touch signal lines 9 from being too close, thereby preventing the touch signals transmitted on the adjacent two touch signal lines 9 from interfering with each other, which affects the touch accuracy. Setting the maximum value of L2 to 2 μm can prevent the touch signal lines 9 from being too far to achieve that these touch signal lines 9 have a relatively high reflectivity to the laser.

Figure 8:
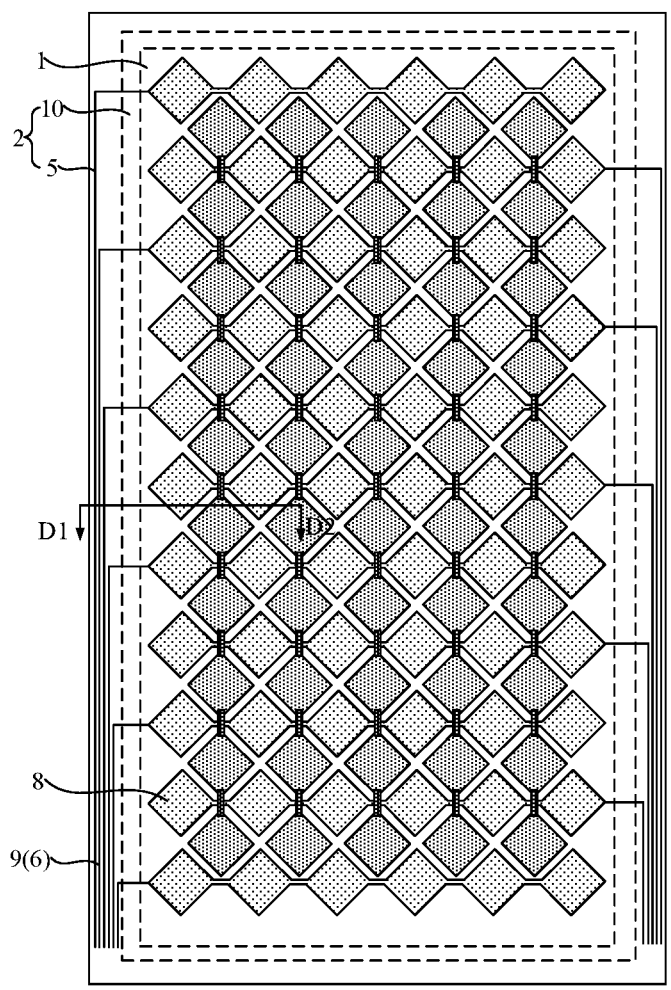
FIG. 8 illustrates yet still another top view of a display panel according to an embodiment of the present disclosure.
Figure 9:
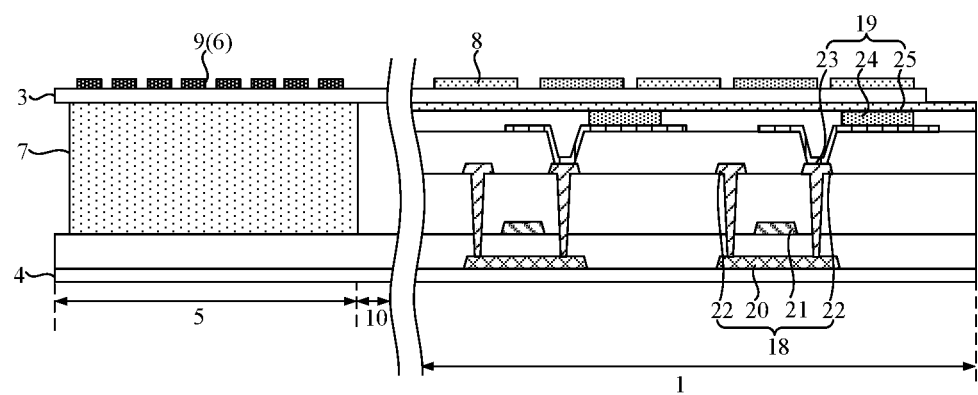
FIG. 9 illustrates a cross-sectional view of FIG. 8 taken along the direction of D1-D2.

FIG. 8 illustrates yet still another top view of a display panel according to an embodiment of the present disclosure and FIG. 9 illustrates a cross-sectional view of FIG. 8 taken along the direction of D1-D2. All the touch signal lines 9 are located in the frit encapsulation area 5, and the first bedding metal 6 is reused as the entire touch signal lines 9.

When the first bedding metal 6 is reused as the entire touch signal lines 9, the number of the touch signal lines 9 serving as the first bedding metal 6 is large. In this way, not only the reflectivity of the touch signal line 9 (the first bedding metal 6) to the laser can be improved so as to improve the encapsulation effect of the encapsulant 7, but also it is not required for the first bedding metal 6 to be additionally provided, thereby reducing production cost. In addition, it is not necessary for the touch signal line 9 to occupy space in the peripheral trace area 10, which can reduce the border width to a greater extent.

In an embodiment, with reference again to FIG. 2, in order to further increase the reflectivity of the first bedding metal 6 to the laser and achieve uniform irradiation of the laser to each area of the encapsulant so as to improve the fusion effect of each area of the encapsulant 7, the first bedding metal 6 may be configured to be a planar structure.

Figure 10:
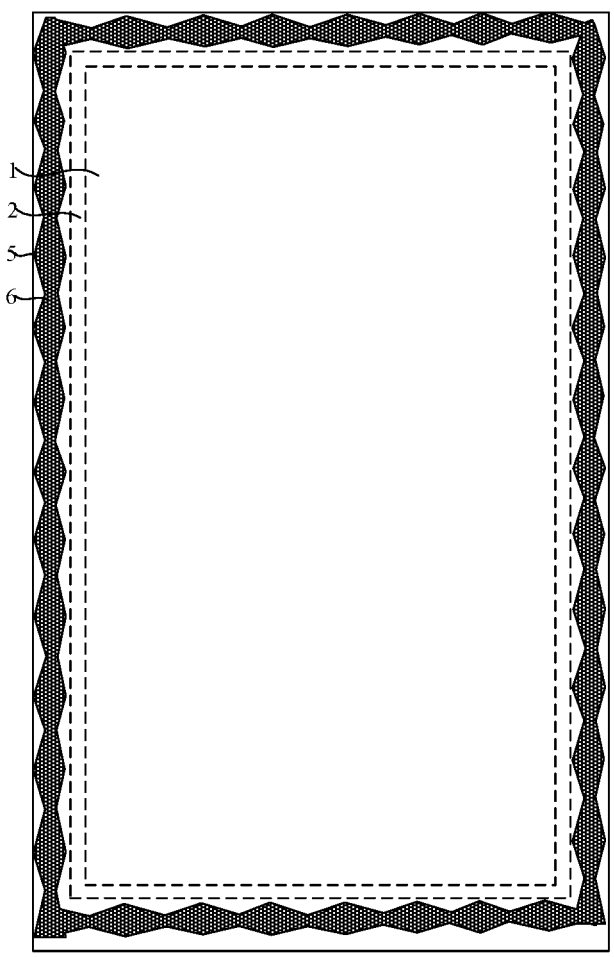
FIG. 10 illustrates a structural schematic diagram of a first bedding metal according to an embodiment of the present disclosure.

It should be noted that the shape of the first bedding metal 6 shown in FIG. 2 is only a schematic description, while it may be further graphically arranged in other alternative embodiments of the present disclosure. In an embodiment, as shown in FIG. 10, FIG. 10 illustrates a structural schematic diagram of a first bedding metal according to an embodiment of the present disclosure. The edge of the first bedding metal 6 may be configured as a non-linear edge, such as a zigzag edge or a wavy edge; with such configuration, when cutting the display panel, since the edge of the first bedding metal 6 is non-linear, only partial area of the edge of may be cut even if the edge of the first bedding metal 6 is cut, thereby reducing the corrosion rate of the entire first bedding metal 6.

Figure 11:
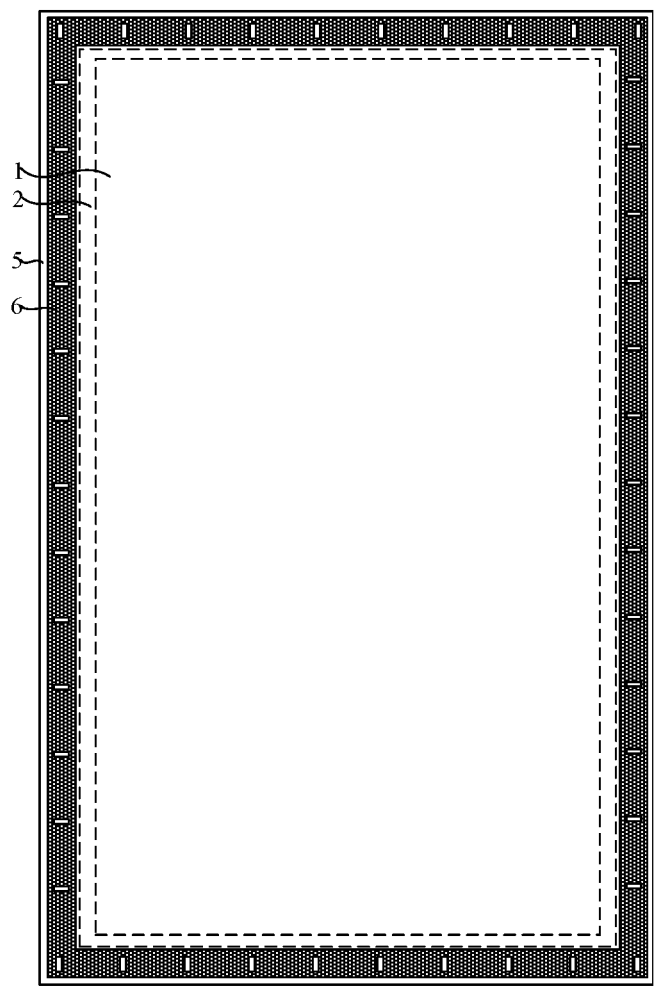
FIG. 11 illustrates another structural schematic diagram of a first bedding metal according to an embodiment of the present disclosure.

FIG. 11 illustrates another structural schematic diagram of a first bedding metal according to an embodiment of the present disclosure. In order to realize various patterning designs of the first bedding metal 6, multiple hollow areas may also be provided in the first bedding metal 6, and the shape of the hollow areas may be a circle, a square or other irregular shapes.

In an embodiment, with reference again to FIG. 3, since the area of the first bedding metal 6 may be larger than the area of the encapsulant 7, the first bedding metal 6 may overlap the encapsulant 7 in a direction perpendicular to the second substrate 4, that is, an orthographic projection of the first bedding metal 6 on the second substrate 4 may cover an orthographic projection of the encapsulant 7 on the second substrate 4 to further increase the reflectivity of the first bedding metal 6 to the laser and achieve uniform irradiation of the laser on each area of the encapsulant, improving the fusion effect of each area of the encapsulant 7.

In an embodiment, with reference again to FIG. 3, the shortest distance between the first bedding metal 6 and the edge of the first substrate 3 is L3, where $30\ \mu m \leq L3 \leq 50\ \mu m$. Since the edge of the first substrate 3 corresponds to the cutting line of the display panel, the first bedding metal 6 is configured to be separated from the edge of the first substrate 3 by 30 μm to 50 μm so as prevent the first bedding metal 6 from being too close to the cutting line. Thus, when cutting the display panel, it is possible to avoid cutting the first bedding metal 6 and exposing the first bedding metal 6. In this way, during the subsequent use of the display panel, it is possible to prevent the first bedding metal 6 from being corroded by external factors, thereby improving the performance stability of the display panel.

Figure 12:
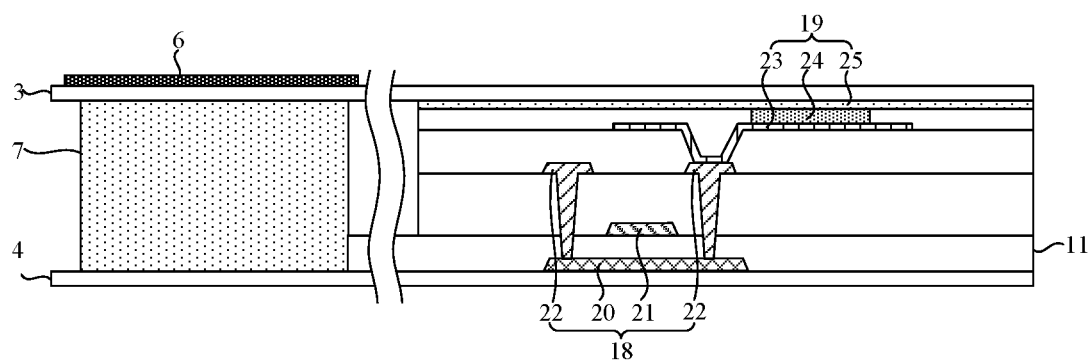
FIG. 12 illustrates another cross-sectional view of FIG. 2 taken along the direction of A1-A2.

FIG. 12 illustrates another cross-sectional view of FIG. 2 taken along the direction of A1-A2. The display panel may further include a first inorganic layer 11. The first inorganic layer 11 is located on a side of the second substrate 4 facing the first substrate 3, and an area, which corresponds to the frit encapsulation area 5 of the first inorganic layer 11, has a blind hole which is used to realize direct contact between the encapsulant 7 and the second substrate 4. It should be noted that the area corresponding to the frit encapsulation area 5 of the first inorganic layer 11 having a blind hole means that the area, which corresponds to the frit encapsulation area 5 of the first inorganic layer 11 is configured to be hollow.

Since the encapsulant 7 is made of a glass adhesive material, the encapsulant 7 and the second substrate 4 are made to be in contact directly based on the good adhesion property of the glass adhesive material and the glass by configuring the area, which is corresponding to the frit encapsulation area 5, of the first inorganic layer 11 to be hollow, which improves the adhesion effect between the encapsulant 7 and the second substrate 4, thereby improving the encapsulation effect of the display panel.

Figure 13:
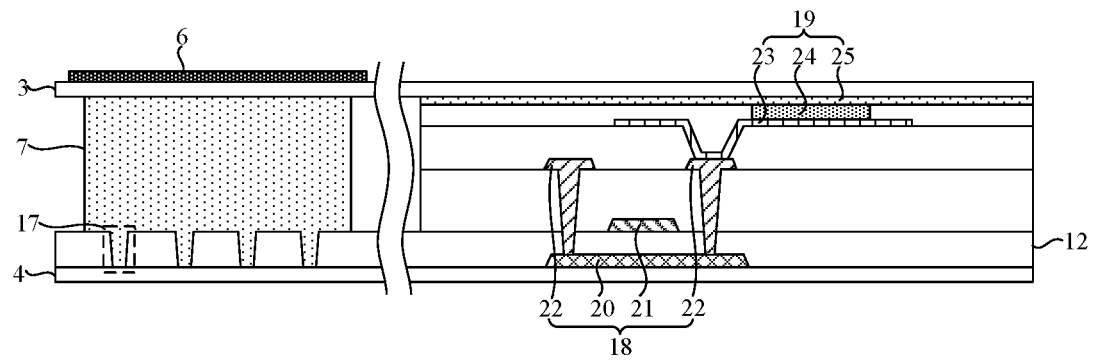
FIG. 13 illustrates still another cross-sectional view of FIG. 2 taken along the direction of A1-A2.

FIG. 13 illustrates still another cross-sectional view of FIG. 2 taken along the direction of A1-A2. The display panel may further include a second inorganic layer 12. The second inorganic layer 12 is located on a side of the second substrate 4 facing the first substrate 3, and an area which corresponds to the frit encapsulation area 5 in the second inorganic layer 12 has an etching hole 17. An encapsulant 7 is provided in the etching hole 17 and is in direct contact with the second substrate 4.

By configuring the encapsulatant 7 to contact the second substrate 4 through the etching hole 17, a part of the encapsulant 7 can contact the second substrate 4 directly based on the good adhesion property of the glass adhesive material and the glass, which improves the adhesion effect between the encapsulant 7 and the second substrate 4, thereby improving the encapsulation effect of the display panel.

Alternatively, with reference again to FIG. 3, the display panel may further include a third inorganic layer 13 which is located on the side of the second substrate 4 facing the first substrate 3, and the encapsulant 7 and the third inorganic layer 13 are in contact. Since the bonding effect between the encapsulant 7 and the inorganic layer is superior to the bonding effect between the encapsulant 7 and the metal material, it is also possible to improve the encapsulation performance of the display panel to some extent by making the encapsulant 7 and the third inorganic layer 13 in contact with each other when comparing with the case where the encapsulant 7 and the bedding metal contact directly in the related art.

It should be noted that the first inorganic layer 11, the second inorganic layer 12, and the third inorganic layer 13 may include an inorganic layer such as a buffer layer or a gate insulation layer. The specific structure and function of the above inorganic layers are the same as those in the related art, which will not be described herein again.

In an embodiment, the first substrate 3 is a touch substrate, and the second substrate 4 is an array substrate. The array substrate is provided with multiple display units, and the display unit includes electrically connected pixel circuit and light-emitting element, and the light-emitting element emits light under the driving of the pixel circuit, to realize an image display of the display panel.

Figure 14:
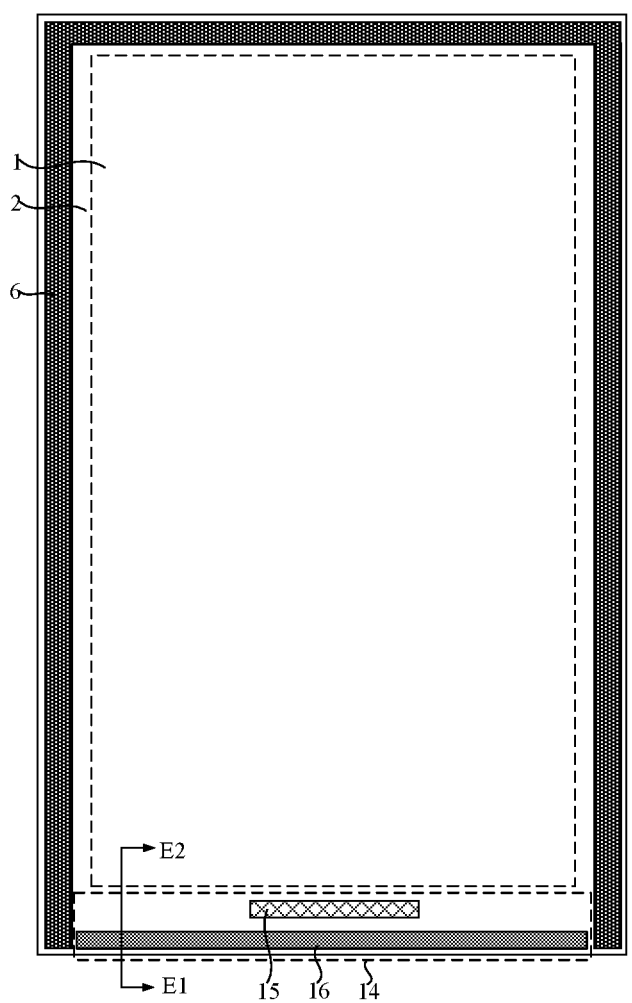
FIG. 14 illustrates a structural schematic diagram of a second bedding metal according to an embodiment of the present disclosure.
Figure 15:
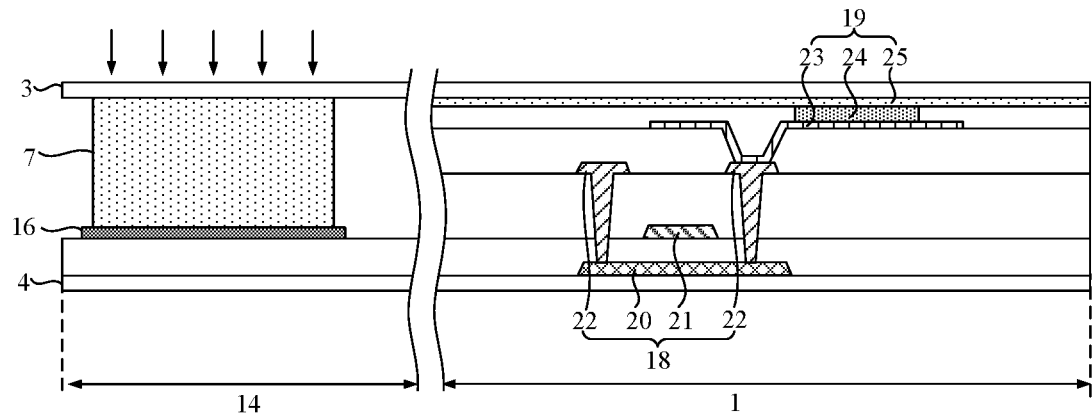
FIG. 15 illustrates a cross-sectional view of FIG. 14 taken along the direction of E1-E2.

FIG. 14 illustrates a structural schematic diagram of a second bedding metal according to an embodiment of the present disclosure, and FIG. 15 illustrates a cross-sectional view of FIG. 14 taken along the direction of E1-E2. When the second substrate 4 is an array substrate, the non-display area 2 includes a first non-display area 14, and the first non-display area 14 includes a chip binding area 15. The first non-display area 14 further includes a second bedding metal 16. The second bedding metal 16 is located on a side of the second substrate 4 facing the first substrate 3.

Based on the structure of the current array substrate, a large number of traces (such as connection traces between the data lines and the chip binding area 15) and binding pins are provided in the first non-display area 14. During the encapsulation process, by providing the second bedding metal 16 on the side of the second substrate 4 facing the first substrate 3, the laser irradiates on the encapsulant 7 along the direction of the first substrate 3 toward the second bedding metal 16 without irradiating on the second substrate 4, thereby avoiding the traces and the binding pins in the first non-display area 14 from being burned by the laser. It can be seen that, by providing the second bedding metal 16, it is also possible to avoid laser damage to the traces and binding pins under the premise that the encapsulation effect of the first non-display area 14 is improved, thereby improving the performance stability of the display panel.

Figure 16:
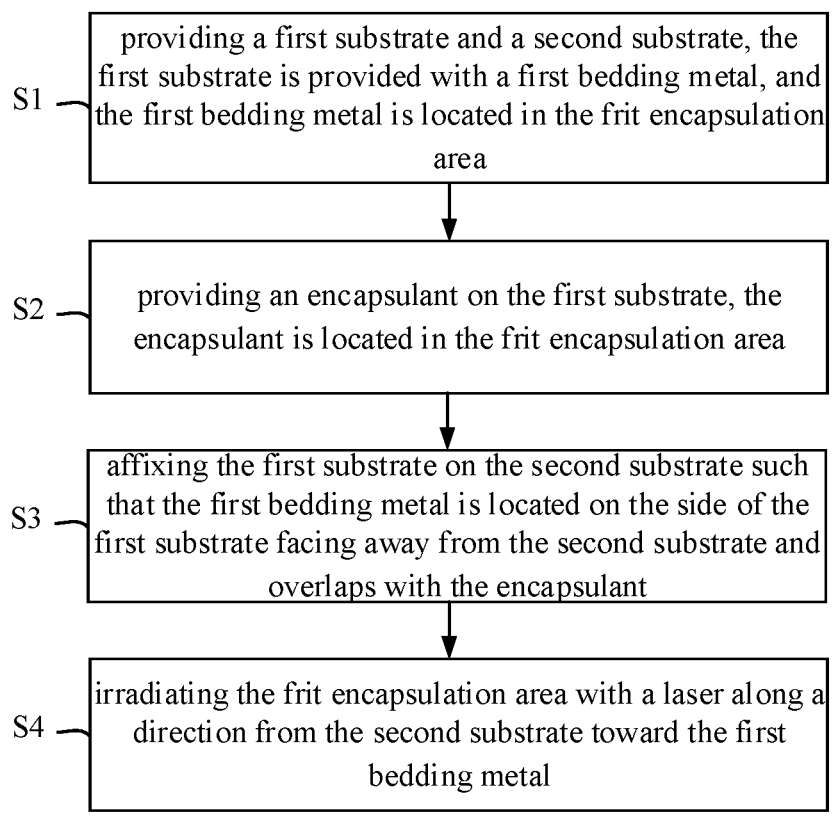
FIG. 16 illustrates a flowchart of an encapsulation method according to an embodiment of the present disclosure.

As shown in FIG. 16 and in combination with FIG. 2 and FIG. 3, the embodiment of the present disclosure further provides an encapsulation method for a display panel, and this encapsulation method is used for encapsulating the above display panel. FIG. 16 illustrates a flowchart of an encapsulation method provided by an embodiment of the present disclosure. The encapsulation method includes:

Step S1: providing a first substrate 3 and a second substrate 4, wherein the first substrate 3 is provided with a first bedding metal 6, and the first bedding metal 6 is located in the frit encapsulation area 5.

Step S2: providing an encapsulant 7 on the first substrate 3, wherein the encapsulant 7 is located in the frit encapsulation area 5.

Step S3: affixing the first substrate 3 on the second substrate 4, such that the first bedding metal 6 is located on the side of the first substrate 3 facing away from the second substrate 4 and overlaps with the encapsulant 7.

Step S4: irradiating the frit encapsulation area 5 with a laser along a direction from the second substrate 4 toward the first bedding metal 6.

With the encapsulation method provided by the embodiments of the present disclosure, when irradiating the frit encapsulation area 5 with the laser along the direction from the second substrate 4 toward the first bedding metal 6 during the encapsulation process, the first bedding metal 6 can reflect the laser, such that the reflected laser is again irradiated onto the encapsulant 7 to increase the irradiation temperature and promote the absorption capability of the encapsulant 7 to the laser, thereby achieving a more ideal melting effect and improving the encapsulation effect; on the other hand, it is also possible to avoid the encapsulant 7 from directly contacting the first bedding metal 6, such that the problem of subsequent encapsulation invalidation caused by poor contact between the encapsulant 7 and the metal material is avoided, thereby improving the encapsulation stability of the display panel.

Figure 17:
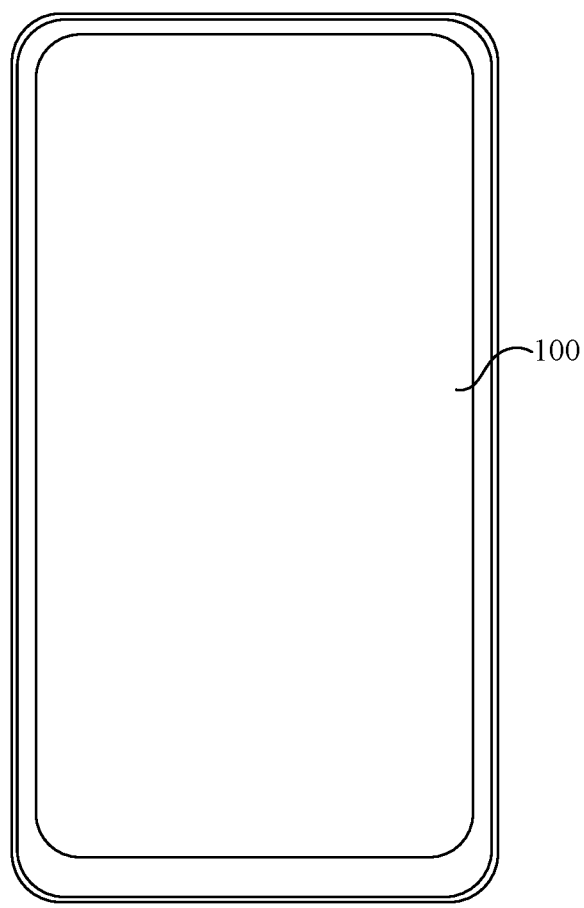
FIG. 17 illustrates a structural schematic diagram of a display device according to an embodiment of the present disclosure.

FIG. 17 illustrates a structural schematic diagram of a display device according to an embodiment of the present disclosure. The display device includes the display panel 100 described above, the specific structure of the display panel 100 has been described in detail in the above embodiments and will be not described herein again. It is appreciated that, the display device shown in FIG. 17 is merely illustrative, and the display device may be any electronic device having a display function such as a mobile phone, a tablet computer, a laptop computer, an electronic paper book, or a television set.

Since the display device provided by the embodiments of the present disclosure includes the above display panel 100, the display device not only has a good encapsulation effect to avoid intrusion of moisture and oxygen from the outside and guarantees stability of the display performance, but also the subsequent encapsulation invalidation caused by poor contact between the encapsulant and the metal material can be avoided, thereby improving the encapsulation stability of the display panel.

While illustrative embodiments have been illustrated and described, it will be appreciated that any modification, equivalent substitution, improvement, etc., made within the spirit and scope of the present disclosure is intended to be included within the scope of the present disclosure.

What is claimed is:

1. A display panel having a display area and a non-display area surrounding the display area, the display panel comprising:
    a first substrate and a second substrate, the first substrate and the second substrate being arranged oppositely to each other, wherein the non-display area comprises a frit encapsulation area and the frit encapsulation area comprises a first bedding metal, the first bedding metal being located on a side of the first substrate facing away from the second substrate;

a plurality of touch electrodes located on the side of the first substrate facing away from the second substrate; and a plurality of touch signal lines located in a same layer as the first bedding metal and electrically connected to the plurality of touch electrodes, wherein the non-display area further comprises a peripheral trace area, the frit encapsulation area is closer to an edge of the non-display area than the peripheral trace area, a part of the plurality of touch signal lines is located in the peripheral trace area, a remaining part of the plurality of touch signal lines is located in the frit encapsulation area, and the first bedding metal is reused as the part of the plurality of touch signal lines located in the frit encapsulation area, wherein a spacing between adjacent two touch signal lines of the remaining part of the plurality of touch signal lines in the frit encapsulation area is smaller than a spacing between adjacent two touch signal lines of the part of the plurality of touch signal lines in the peripheral trace area.

2. The display panel according to claim 1, wherein the first bedding metal and the plurality of touch signal lines are provided in a same layer.

3. The display panel according to claim 2, wherein the first bedding metal is electrically connected to a fixed potential.

4. The display panel according to claim 1, wherein a spacing between two adjacent touch signal lines of the remaining part of the plurality of touch signal lines in the frit encapsulation area is L2, where 1.5 µm≤L2≤2 µm.

5. The display panel according to claim 1, wherein a shortest distance between the first bedding metal and an edge of the first substrate is L3, where 30 µm≤L3≤50 µm.

6. The display panel according to claim 1, wherein the frit encapsulation area comprises an encapsulant.

7. The display panel according to claim 6, wherein the first bedding metal overlaps the encapsulant in a direction perpendicular to the second substrate.

8. The display panel according to claim 6, further comprising:

a first inorganic layer that is located on a side of the second substrate facing the first substrate, wherein a region in the first inorganic layer corresponding to the frit encapsulation area has a blind hole, and the encapsulant is in contact with the second substrate via the blind hole.

9. The display panel according to claim 6, further comprising:

a second inorganic layer, that is located on a side of the second substrate facing the first substrate, wherein a region in the second inorganic layer corresponding to the frit encapsulation area has an etched hole, and a part of the encapsulant is provided in the etched hole and is in contact with the second substrate.

10. The display panel according to claim 6, further comprising:

a third inorganic layer, the third inorganic layer being located on a side of the second substrate facing the first substrate, wherein the encapsulant is in contact with the third inorganic layer.

11. The display panel according to claim 1, wherein the first substrate is a touch substrate and the second substrate is an array substrate.

12. The display panel according to claim 11, wherein the non-display area comprises a first non-display area, the first non-display area comprising a chip binding area, and the first non-display area further comprises a second bedding metal, the second bedding metal being located on a side of the second substrate facing the first substrate.

13. An encapsulation method for encapsulating a display panel, the encapsulation method comprising:

providing a first substrate and a second substrate, wherein the display panel comprises the first substrate and the second substrate that are arranged oppositely to each other, the non-display area comprises a frit encapsulation area, the first substrate is provided with a first bedding metal, and the first bedding metal is located in the frit encapsulation area;

providing an encapsulant on the first substrate, the encapsulant being located in the frit encapsulation area;

affixing the first substrate on the second substrate, such that the first bedding metal is located on a side of the first substrate facing away from the second substrate and overlaps with the encapsulant; and irradiating the frit encapsulation area with laser light along a direction from the second substrate toward the first bedding metal, wherein the display panel further comprises a plurality of touch electrodes located on the side of the first substrate facing away from the second substrate, and a plurality of touch signal lines located in a same layer as the first bedding metal and electrically connected to the plurality of touch electrodes; the non-display area further comprises a peripheral trace area, the frit encapsulation area is closer to an edge of the non-display area than the peripheral trace area, a part of the plurality of touch signal lines is located in the peripheral trace area and a remaining part of the plurality of touch signal lines is located in the frit encapsulation area, and the first bedding metal is reused as the part of the plurality of touch signal lines located in the frit encapsulation area; and a spacing between adjacent two touch signal lines of the remaining part of the plurality of touch signal lines in the frit encapsulation area is smaller than a spacing between adjacent two touch signal lines of the part of the plurality of touch signal lines in the peripheral trace area.

14. A display device, comprising a display panel having a display area and a non-display area surrounding the display area, wherein the display panel comprises:

a first substrate and a second substrate, the first substrate and the second substrate being arranged oppositely to each other, wherein the non-display area comprises a frit encapsulation area and the frit encapsulation area comprises a first bedding metal, the first bedding metal is located on a side of the first substrate facing away from the second substrate;

a plurality of touch electrodes located on the side of the first substrate facing away from the second substrate; and a plurality of touch signal lines located in a same layer as the first bedding metal, and electrically connected to the plurality of touch electrodes, wherein the non-display area further comprises a peripheral trace area, the frit encapsulation area is closer to an edge of the non-display area than the peripheral trace area, a part of the plurality of touch signal lines is located in the peripheral trace area, a remaining part of the plurality of touch signal lines is located in the frit encapsulation area, and the first bedding metal is reused as the part of the plurality of touch signal lines located in the frit encapsulation area, wherein a spacing between adjacent two touch signal lines of the remaining part of the plurality of touch signal lines in the frit encapsulation area is smaller than a spacing between adjacent two touch signal lines of the part of the plurality of touch signal lines in the peripheral trace area.

* * * * *